United States Patent
Nishimura et al.

(10) Patent No.: US 8,652,269 B2
(45) Date of Patent: Feb. 18, 2014

(54) FLUX COMPOSITION AND SOLDERING PASTE COMPOSITION

(75) Inventors: Tetsuro Nishimura, Osaka (JP); Mitsuhiro Kawahara, Osaka (JP); Masuml Asakawa, Ibaraki (JP); Toshimi Shimizu, Ibaraki (JP)

(73) Assignee: Nihon Superior Co., Ltd. (JP)

( * ) Notice: Subject to any disclaimer, the term of this patent is extended or adjusted under 35 U.S.C. 154(b) by 153 days.

(21) Appl. No.: 13/121,734

(22) PCT Filed: Sep. 25, 2009

(86) PCT No.: PCT/JP2009/066615
§ 371 (c)(1),
(2), (4) Date: May 17, 2011

(87) PCT Pub. No.: WO2010/038668
PCT Pub. Date: Apr. 8, 2010

(65) Prior Publication Data
US 2011/0220247 A1    Sep. 15, 2011

(30) Foreign Application Priority Data
Oct. 2, 2008    (JP) .................................. 2008-257470

(51) Int. Cl.
*B23K 35/36*    (2006.01)
*B23K 35/363*    (2006.01)

(52) U.S. Cl.
USPC ................ 148/24; 148/23; 977/734; 977/902

(58) Field of Classification Search
USPC ............................... 148/23, 24; 977/734, 902
See application file for complete search history.

(56) References Cited

U.S. PATENT DOCUMENTS

| 2003/0168123 A1 | 9/2003 | Wada et al. |
| 2006/0160248 A1* | 7/2006 | Kamiya et al. ................ 438/1 |
| 2009/0202641 A1 | 8/2009 | Asakawa et al. |

FOREIGN PATENT DOCUMENTS

| JP | 55-094793 | 7/1980 |
| JP | 03-216292 | 9/1991 |
| JP | 05-318176 | 12/1993 |
| JP | 06-234094 | 8/1994 |
| JP | 2003-260589 | 9/2003 |
| JP | 2006-110580 | 4/2006 |
| WO | 2007/145158 | 12/2007 |

OTHER PUBLICATIONS

Nai et al. "Lead-Free Solder Reinforced with Multiwalled Carbon Nanotubes" Journal of Electronic Materials, 35 (7), 2006, 1518-1522.*
Diepstraten "Reflow Soldering with a SnCu Eutectic Pb-Fee Alloy", Circuit Assembly, 19 (9), 2008, 34.*
PCT, International Search Report, International Application No. PCT/JP2009/066615 (mailed Dec. 22, 2009; published Apr. 8, 2010).
PCT, International Preliminary Report on Patentability, International Application No. PCT/JP2009/066615 (mailed May 19, 2011).

* cited by examiner

*Primary Examiner* — Rebecca Lee
(74) *Attorney, Agent, or Firm* — Thompson Hine L.L.P.

(57) ABSTRACT

Disclosed herein are a flux and a soldering paste based on the flux. The flux is free from a change in viscosity with age, "skinned surface," and "rough and crumbling," and is excellent in printability and solderability. The flux contains, as elements, a resin, a thixo agent, an activator, a solvent and glucopyranosylamine type nanotube. The soldering paste further contains a solder powder. Preferably, the solder powder is free from lead.

33 Claims, 2 Drawing Sheets

FLUX COMPOSITION AND SOLDERING PASTE COMPOSITION

TECHNICAL FIELD

The present invention relates to a flux and a soldering paste for use in reflow soldering.

BACKGROUND ART

Reflow soldering is widely used to surface mount electronic components on a PC board or the like. Solder pastes are applied, and printed on the PC board, and components are then mounted on the soldering paste on the PC board. These elements are then heated in a reflow oven to melt the soldering paste to bond the electronic component on the PC board.

The soldering paste used in the reflow soldering contains a mixture of a flux and a solder powder. The flux includes a thixo agent, an activator, and a solvent mixed at an appropriate ratio with a rosin resin or a derivative of the rosin resin serving as the base material thereof. The solder power may be an alloy power based on an Sn—Pb system, an Sn—Ag system, an Sn—Cu system, an Sn—Ag—Cu system, an Sn—Bi system, an Sn—Sb system, an Sn—In system, an Sn—Zn system, or the like. The noticeable trend is that a solder powder containing no lead has been used in view of environment problems for recent years.

Since the solder powder and the activator in the flux are in a mixed state in these soldering pastes, the solder powder and the activator may react with each other during storage, causing the soldering paste to change in viscosity. Quality degradation takes place due to deteriorations with age, such as "skinned surface," and "rough and crumbling." "Skinned surface" refers to the state that the surface of the soldering paste is solidified to form a film. "Rough and crumbling" refers to the phenomenon that the entire paste loses viscosity.

The solder past suffering from deteriorations with age, such as a viscosity transition, "skinned surface," and "rough and crumbling" during storage leads to a printing failure on a PC board, and an extreme degradation in wettability of the solder powder. Solder joint failures thus result. Several hours to several tens of hours may occasionally elapse between the printing of the soldering paste on the PC board and the reflow operation. If the deteriorations with age such as a viscosity transition, "skinned surface" and "rough and crumbling" take place during that period, wettability deteriorates. A joint failure thus results between the PC board and the electronic component. A variety of techniques have been proposed to overcome such problems.

RELATED ART DOCUMENTS

Patent Documents

Patent document 1: Japanese Open Gazette No. 55-94793
Patent document 2: Japanese Open Gazette No. 3-216292
Patent document 3: Japanese Open Gazette No. 5-318176
Patent document 4: Japanese Open Gazette No. 6-234094

Document 1 discloses a method in which the solder powder is covered with covering material (such as gelatin) that has low solubility with the flux and is easily fused or destroyed by heat in order to prevent the solder powder from directly contacting the flux. Document 2 discloses a method in which malonic acid or amine salt thereof is added to the flux to cover the surface of the solder powder with malonic acid and the like, and thus controls a reaction between the solder powder and the flux. Document 3 discloses a method in which an increase in the viscosity of the soldering paste is controlled by adding carboxylic acid having a dissociation constant of 2.5 or less or a derivative thereof. Document 4 discloses a method in which a lime resin is used to prevent a metallic soap from being created as a result of a reaction of rosin as a resin component with the solder powder.

SUMMARY OF THE INVENTION

Problems to be Solved by the Invention

The method of covering the solder powder, from among the above-described related arts, has not only a problem that a paste production operation becomes complex, but also an increase in the production costs, and a non-uniform density problem caused by cohesion of the solder powder and the activator within the paste. The method of adding malonic acid or an organic acid having a dissociation constant of 2.5 or less has, in addition to the above-described problems, a problem that the advantage thereof is different depending on the composition of the solder metal, and does not always provide effectiveness of the method. If a lime resin is used as a resin component, the acid number of the resin component falls, and solderability deteriorates.

The object of the invention is to disclose a flux, and a soldering paste employing the flux which is free from the generation of a viscosity transition with age, "skinned surface," and "rough and crumbling," provides excellent performance in view of applicability, printability, and solderability, and high joint reliability, and is reliably used with leadfree solder of an Sn—Cu system or an Sn—Ag system.

Means for Solving the Problems

The inventors of this invention have found that the inclusion of a particular nanotube component into a flux effectively controls deteriorations with age subsequent to the production of a soldering paste, and increases an activation effect of the flux. With the findings, the inventors have reached the invention.

According to the invention, a flux includes a resin, a thixo agent, an activator, a solvent, and nanotube of glucopyranosylamine type. A solder paste is obtained by including a solder powder in the flux.

According to the invention, the inclusion of glucopyranosylamine type nanotube into the flux component controls a rise in the viscosity with age. The inclusion of the activator in the nanotube even further controls a viscosity rise control effect. The inclusion of the activator in the nanotube increases heat resistance of the activator. More specifically, the inclusion of the activator in the nanotube controls a decrease in the activation performance of the activator contained in the flux during a pre-heating operation or a heating operation during soldering in an operation of bonding an electronic component on a PC board or the like. This arrangement allows the activator used in the flux to be reduced in amount and a milder type of activator to be used.

The nanotube used in the invention is of a glucopyranosylamine type represented by the following formula (chemical formula 1), and the content of the nanotube is not limited to any value. The inventors have learned that the nanotube preferably has a content of 0.01 to 10 weight percent in the flux.

Chemical formula 1

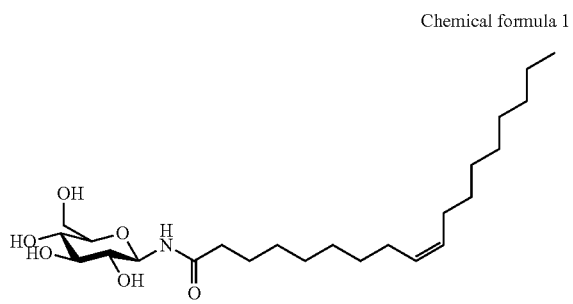

No limitation is imposed to the resin component used in this invention and any resin component may be used as long as the resin component has the advantage of the invention. A preferable resin component is a rosin-based resin. The rosin-based resins include rosin, and a derivative thereof such as modified rosin, and these components may be used in combination. More specifically, the rosin-based resins include gum rosin, wood rosin, polymerized rosin, phenol modified rosin, and the derivatives thereof. An acrylic resin may also be used together in combination. No particular limitation is imposed on the content of the resin, but the resin preferably has a content of 25-75 weight percent in the flux.

The activator used in this invention is not limited to any type. More specifically, hydrogen halogenide of organic amine includes diphenyl guanidine hydrobromide, cyclohexylamine hydrobromide, diethylamine hydrochloride, triethanolamine hydrobromide, or monoethanolamine hydrobromide. Dicarboxylic acid is preferred as the organic acid. The organic acids also include malonic acid, succinic acid, maleic acid, glutric acid, suberic acid, adipic acid, sebacic acid, and the like. The activator is not limited to any particular content, but preferably has a content of 0.01-30 weight percent in the flux.

The thixo agent used in this invention is not limited to any particular type. Any thixo agent is acceptable as long as the agent does not degrade the advantages of the invention. More specifically, the thixo agents may include hydrogen additive castor oil, fatty acid amides, oxy fatty acids, and castor wax. The thixo agent typically has a content of 0.01-15 weight percent in the flux.

In view of the current noticeable trend, the solder powder used in the invention is preferably leadfree solder having no lead component. However, an alloy containing lead is not excluded as a solder powder candidate. More specifically, an Sn—Cu—Ni solder alloy or an Sn—Ag—Cu solder alloy currently used as a mainstream leadfree solder alloy is used. The solder powder may include other materials than these main elements. For example, the solder powder may include an alloy of at least one element selected from the group consisting of Bi, In, Zn, Al, Sb, Au, Pt, Ga, Ge, Co, Fe, P, Si, Mn, Te, and Pd. The alloy does not fall outside the range of the invention as long as the solder alloy is based on the Sn—Cu—Ni solder alloy or the Sn—Ag—Cu solder alloy. The leadfree solder powder preferably has a content of 70-95 weight percent in the soldering paste. The solder powder particle is not limited to any particular shape, and may be spherical or indefinite in shape. The solder powder particle is preferably spherical in view of uniform dissolution during the reflow operation. The particle diameter is preferably within a range of 0.1-100 μm.

The solvent used in this invention is not limited to any particular solvent. Any solvent is acceptable as long as the solvent does not degrade the advantages of the invention. More specifically, the solvents include hexyl carbitol, butyl carbitol, ethylene glycol monobutyl ether, and the like. The solvent is not limited to any content, but preferably has a content of 20-80 weight percent in the solder flux.

An additive such as an anti-oxidant may be included at an appropriate content in the flux and the soldering paste of the invention as long as the inclusion of the additive does not degrade the advantages of the invention.

No limitation is imposed on the manufacturing method of the flux and the soldering paste of the invention and any method is applicable as long as the method does not degrade the advantages of the invention. As effective components for the flux, a resin, an activator, a thixo agent, and nanotube of glucopyranosylamine type are uniformly mixed into a solvent to obtain the flux. The soldering paste is obtained by mixing and milling the solder powder with the flux uniformly.

Advantages

According to this invention, the inclusion of glucopyranosylamine type nanotube into the flux component controls the deteriorations with time such as a rise in the viscosity with age, "skinned surface," and "rough and crumbling," and provides excellent wettability, and high reliability characteristics. Because of high activation effect and because the flux is manufactured in an aquatic composition system, an increase in the amount of the activator in the flux is restricted. It is also possible to provide a flux of VOC free type, and a VOC free type soldering paste containing the VOC free flux.

BEST MODE FOR CARRYING OUT THE INVENTION

The embodiment of the invention are described in detail. The following embodiment support the invention, but are not intended to limit the scope of the invention.

Embodiments

"Verification of Inclusion Effect"

An increase in heat resistance caused by the inclusion of activator within the nanotube was verified using a thermogravimetry and differential thermal analysis (TG-DTA).

"Specimen and Preparation Method"

An inclusion process was performed on specimens, glucopyranosylamine type nanotube as a component of the invention and acetic acid (CH3COOH) under reduced pressure to produce acetic-acid inclusion processed nanotube. Two types of acetic acid were prepared by performing and not performing the inclusion process on a mixture of glucopyranosylamine type nanotube and acetic acid mixed at room temperature. The differential thermal analysis, as is known in the art, refers to a detection of a temperature difference that takes place when a specimen and a reference material are heated and cooled. The differential thermal analysis is based on the fact that a transition takes place in the temperature difference with respect to the reference material if the specimen fuses or reacts in response to a temperature transition. According the embodiment, acetic acid was used to verify the differential heat. Acetic acid is one of the same organic acids as malonic acid used in the flux, and has been conventionally used in the flux. Acetic acid has a relatively simple chemical structure and remains a liquid at room temperature. Stable experiments are possible with acetic acid. In view of these conditions, acetic acid was selected in the embodiment.

"Verification of Improvement of Heat Resistance"

Thermogravimetry and differential thermal analysis (TG-DTA) was used to measure differential heat and weight trend of the specimens under the following conditions, and improvements in heat resistance was verified.

"Measurement Conditions"

| | |
|---|---|
| Measurement device: Thermogravimetry and differential thermal analysis (TG-DTA) TG-8120 manufactured by Rigaku Corporation | |
| Measurement conditions: Specimen weight | 10 mg |
| Temperature rising rate | 60° C./minute |
| Maximum temperature | 300° C. |

"Measurement Results"

Figure 1:
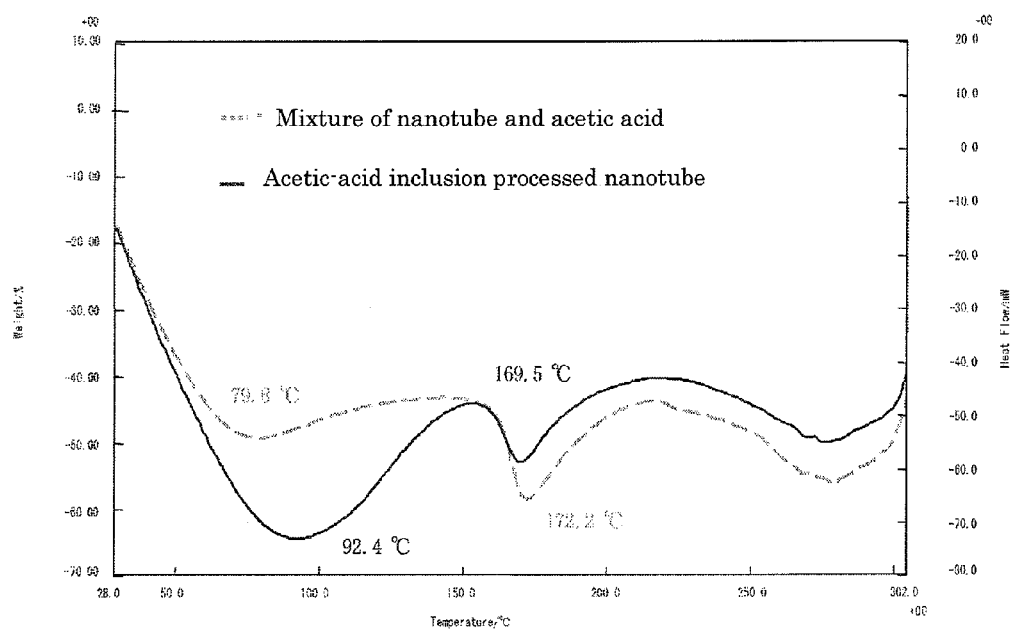
FIG. 1 is a graph illustrating measurement results of differential heat between a specimen having undergone an inclusion process and a specimen not having undergone the inclusion process, wherein acetic acid is included in glucopyranosylamine type nanotube as a component of the invention.
Figure 2:
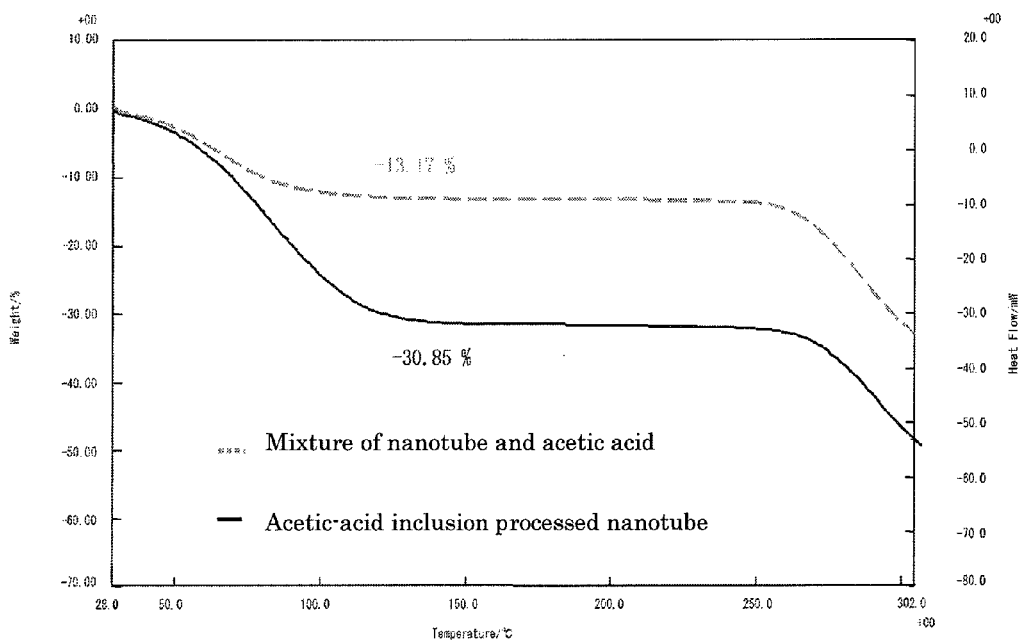
FIG. 2 is a graph illustrating measurement results of a weight change of the specimen having undergone the inclusion process and the specimen not having undergone the inclusion process, wherein acetic acid is included in glucopyranosylamine type nanotube as a component of the invention.

FIG. 1 illustrates comparison results between the differential heat of acetic-acid inclusion processed nanotube and acetic-acid inclusion non-processed nanotube. As illustrated in FIG. 1, the peak of the acetic-acid inclusion processed nanotube shifts into a high temperature region by 10° C. or higher in comparison with the acetic acid inclusion non-processed nanotube. FIG. 2 illustrates comparison results of weight trends of the acetic-acid inclusion processed nanotube and the acetic-acid inclusion non-processed nanotube. As illustrated in FIG. 2, the weight decrease of the acetic-tube inclusion processed nanotube continues to a temperature beyond 118° C. and then flattens out toward approximately 260° C. The weight decrease of the acetic-tube inclusion non-processed nanotube flattens out at the vicinity of 90° C. A weight decrease rate of the acetic-tube inclusion processed nanotube is about three times that of the acetic-tube inclusion non-processed nanotube in a flat-out state. The results of differential heat and the weight trend described above show that acetic acid is included in the glucopyranosylamine type nanotube as the component of the invention.

Figure 3:
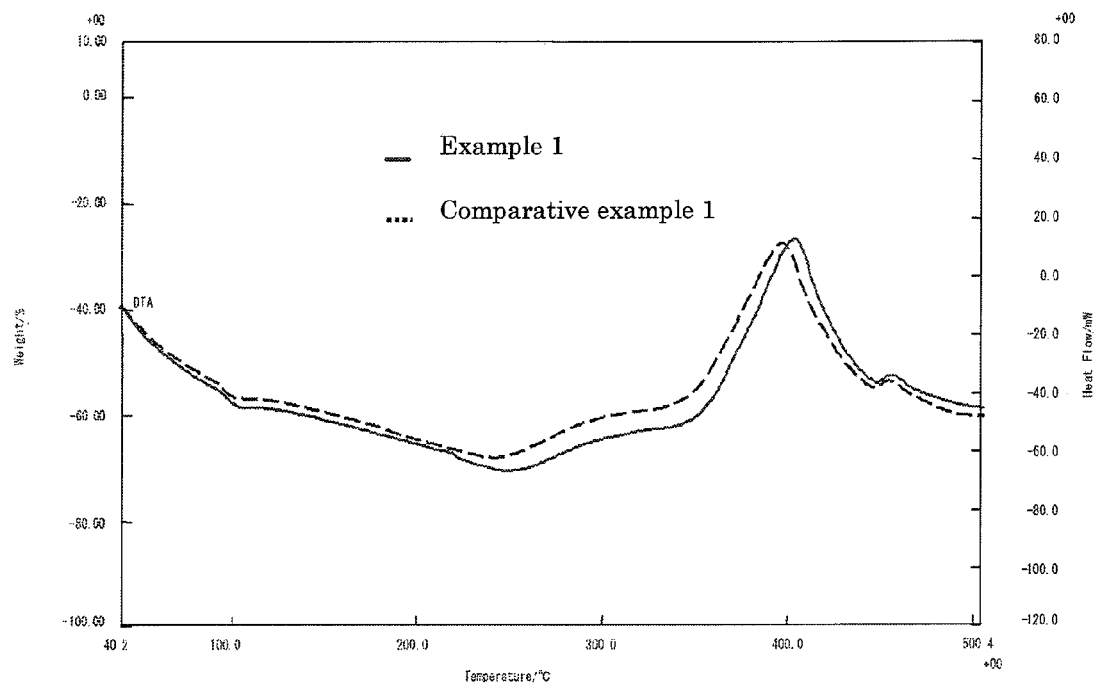
FIG. 3 is a graph illustrating measurement results of the differential heat of an example 1 of the invention and a comparative example 1.
Figure 4:
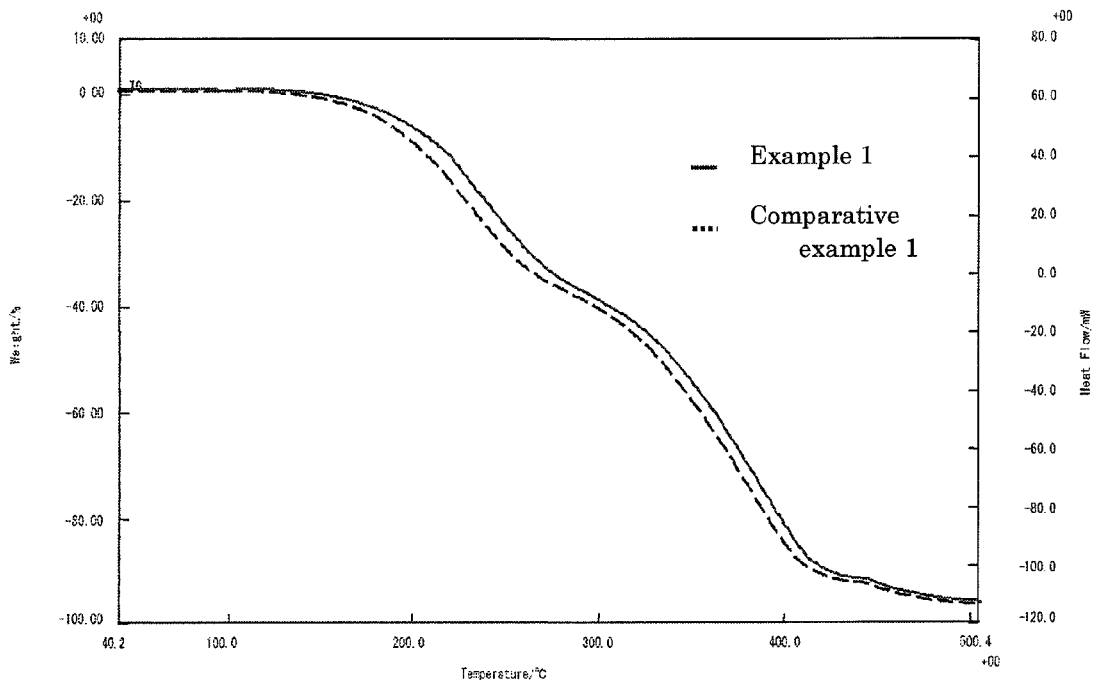
FIG. 4 is a graph illustrating measurement results of a weight change of the example 1 of the invention and the comparative example 1.

The differential heat and the weight trend of example 1 and comparative example 1 were measured under the condition described below using the thermogravimetry and differential thermal analysis (TG-DTA). Used in example 1 was malonic acid in which glucopyranosylamine type nanotube as the component of the invention underwent the inclusion process. An improvement in thermal resistance was verified. FIGS. 3 and 4 illustrate the results.

"Measurement Conditions"

| | |
|---|---|
| Measurement device: Thermogravimetry and differential thermal analysis (TG-DTA) TG-8120 manufactured by Rigaku Corporation | |
| Measurement conditions: Specimen weight | 10 mg |
| Temperature rising rate | 60° C./minute |
| Maximum temperature | 500° C. |

"Measurement Results"

The peak in example 1 shifts into a high temperature region by 3-5° C. in comparison with comparative example 1 as illustrated in FIG. 3. Example 1 is higher than comparative example 1 in temperature from the start to the end of the weight decrease in FIG. 4. These graphs show that the inclusion of malonic acid to nanotube has increased thermal resistance of the activator.

Discussed next is the effect on changes with age and wettability of the flux and the soldering paste based on the flux of the invention.

"Preparation of Solder Flux"

Specimens listed in tables 1 and 2 were prepared in accordance with the method discussed below to produce example 1-7, and comparative examples 1-7.

"Manufacturing Method"

Modified rosin, castor wax, an activator, and hexyldiglycol are heated and mixed to be uniformed. Glucopyranosylamine type nanotube is then added, and further mixed to be uniformed.

TABLE 1

| Component name | Example 1 | Example 2 | Example 3 | Example 4 | Example 5 | Example 6 | Example 7 |
|---|---|---|---|---|---|---|---|
| Modified rosin | 50.0 | 50.0 | 50.0 | 50.0 | 50.0 | 50.0 | 50.0 |
| Castor wax | 10.0 | 7.0 | 7.0 | 7.0 | 7.0 | 7.0 | 7.0 |
| Malonic acid | 1.0 | — | — | — | — | — | — |
| Glutaric acid | — | 1.0 | — | — | — | — | — |
| Sebacic acid | — | — | 1.0 | — | — | — | — |
| Suberic acid | — | — | — | 1.0 | — | — | — |
| Azetine acid | — | — | — | — | 1.0 | — | — |
| Adipic acid | — | — | — | — | — | 1.0 | — |
| Succinic acid | — | — | — | — | — | — | 1.0 |
| Glucopyranosylamine Type nanotube | 1.0 | 1.0 | 1.0 | 1.0 | 1.0 | 1.0 | 1.0 |
| Hexyldiglycol | 38.0 | 41.0 | 41.0 | 41.0 | 41.0 | 41.0 | 41.0 |
| Total | 100.0 | 100.0 | 100.0 | 100.0 | 100.0 | 100.0 | 100.0 |

TABLE 2

| Component name | Comparative example 1 | Comparative example 2 | Comparative example 3 | Comparative example 4 | Comparative example 5 | Comparative example 6 | Comparative example 7 |
|---|---|---|---|---|---|---|---|
| Modified rosin | 50.0 | 50.0 | 50.0 | 50.0 | 50.0 | 50.0 | 50.0 |
| Castor wax | 10.0 | 7.0 | 7.0 | 7.0 | 7.0 | 7.0 | 7.0 |
| Malonic acid | 1.0 | — | — | — | — | — | — |
| Glutaric acid | — | 1.0 | — | — | — | — | — |
| Sebacic acid | — | — | 1.0 | — | — | — | — |
| Suberic acid | — | — | — | 1.0 | — | — | — |
| Azetine acid | — | — | — | — | 1.0 | — | — |
| Adipic acid | — | — | — | — | — | 1.0 | — |
| Succinic acid | — | — | — | — | — | — | 1.0 |
| Glucopyranosyl amine type nanotube | — | — | — | — | — | — | — |
| Hexyldiglycol | 39.0 | 42.0 | 42.0 | 42.0 | 42.0 | 42.0 | 42.0 |
| Total | 100.0 | 100.0 | 100.0 | 100.0 | 100.0 | 100.0 | 100.0 |

"Preparation of Solder Paste"

The specimens listed in Tables 3 and 4 are mixed and milled to prepare examples 8-14, and comparative examples 8-14.

Particles of the solder powder used have a spherical shape having a particle diameter within a range of 10-40 μm and an alloy composition of Sn-0.7Cu-0.05Ni.

TABLE 3

| Component name | Example 8 | Example 9 | Example 10 | Example 11 | Example 12 | Example 13 | Example 14 |
|---|---|---|---|---|---|---|---|
| Example 1 flux | 20 | — | — | — | — | — | — |
| Example 2 flux | — | 20 | — | — | — | — | — |
| Example 3 flux | — | — | 20 | — | — | — | — |
| Example 4 flux | — | — | — | 20 | — | — | — |
| Example 5 flux | — | — | — | — | 20 | — | — |
| Example 6 flux | — | — | — | — | — | 20 | — |
| Example 7 flux | — | — | — | — | — | — | 20 |
| Solder powder | 80 | 80 | 80 | 80 | 80 | 80 | 80 |
| Total | 100 | 100 | 100 | 100 | 100 | 100 | 100 |

TABLE 4

| Component name | Comparative example 8 | Comparative example 9 | Comparative example 10 | Comparative example 11 | Comparative example 12 | Comparative example 13 | Comparative example 14 |
|---|---|---|---|---|---|---|---|
| Comparative example 1 flux | 20 | — | — | — | — | — | — |
| Comparative example 2 flux | — | 20 | — | — | — | — | — |
| Comparative example 3 flux | — | — | 20 | — | — | — | — |
| Comparative example 4 flux | — | — | — | 20 | — | — | — |
| Comparative example 5 flux | — | — | — | — | 20 | — | — |
| Comparative example 6 flux | — | — | — | — | — | 20 | — |
| Comparative example 7 flux | — | — | — | — | — | — | 20 |
| Solder powder | 80 | 80 | 80 | 80 | 80 | 80 | 80 |
| Total | 100 | 100 | 100 | 100 | 100 | 100 | 100 |

Changes with age of examples 8-14 and comparative examples 8-14 are checked and listed in Tables 5 and 6.

The "change in viscosity" of the specimens as an evaluation of stability with age was measured under a condition of the number of rotation of 10 rpm using spiral viscometer PCU-205 manufactured by MALCOM Co., Ltd. after the specimens were left at 25° C. in a still state for an hour subsequent to the preparation. The specimens were then put into a constant temperature bath at 40° C., and left there for 168 hours, and the viscosity of the specimens was measured under the same condition. To evaluate "rough and crumbling," the specimens were visually checked before and after the introduction of thereof into the constant temperature bath at 40° C.

Evaluation criteria are listed in Table 8.

TABLE 5

| Evaluation item | | Example 8 | Example 9 | Example 10 | Example 11 | Example 12 | Example 13 | Example 14 |
|---|---|---|---|---|---|---|---|---|
| Change in viscosity | 5° C. | ◉ | ◉ | ◉ | ◉ | ◉ | ◉ | ◉ |
| | 20° C. | ○ | ◉ | ◉ | ◉ | ◉ | Δ | ◉ |
| | 40° C. | Δ | Δ | Δ | Δ | Δ | Δ | Δ |
| Degree of rough and crumbling | | ○ | ○ | ○ | ○ | ○ | ○ | ○ |

TABLE 6

| Evaluation item | | Comparative example 8 | Comparative example 9 | Comparative example 10 | Comparative example 11 | Comparative example 12 | Comparative example 13 | Comparative example 14 |
|---|---|---|---|---|---|---|---|---|
| Change in viscosity | 5° C. | ○ | ◉ | ◉ | ◉ | ◉ | ○ | ◉ |
| | 20° C. | Δ | Δ | ○ | ◉ | ○ | Δ | ○ |
| | 40° C. | X | X | X | X | X | X | X |
| Degree of rough and crumbling | | X | Δ | ○ | ○ | ○ | Δ | ○ |

Wettability as an important characteristic of the flux was checked using examples 1-7 and comparative examples 1-7. Table 7 lists check results.

Copper plates (25×30×0.5 mm) were used as specimens for evaluation. The copper plates were heated under heating conditions of 250° C. for 30 seconds without being pre-heated, and evaluation criteria are listed in Table 8.

TABLE 7

| Evaluation item | Example 1 | Example 2 | Example 3 | Example 4 | Example 5 | Example 6 | Example 7 |
|---|---|---|---|---|---|---|---|
| Wettability | ○ | ○ | ○ | ○ | Δ | Δ | Δ |

| Evaluation item | Comparative example 1 | Comparative example 2 | Comparative example 3 | Comparative example 4 | Comparative example 5 | Comparative example 6 | Comparative example 7 |
|---|---|---|---|---|---|---|---|
| Wettability | Δ | Δ | X | X | X | X | X |

TABLE 8

"Transition in viscosity"
Viscosity was measured at the preparation time and
after a time elapse of 168 hours, and rates of change
were calculated to establish the follow evaluation criteria.

| Evaluation criteria (rate of transition) | Evaluation |
|---|---|
| Less than 5% | ⊙ |
| 5-15% | ○ |
| 15-30% | Δ |
| More than 30% | X |

"Rough and crumbling"
The specimens were visually checked as to how the
specimens had changed for 24 hours since the preparation,
and the following evaluation criteria were established.

| Evaluation criteria | Evaluation |
|---|---|
| Good | ○ |
| Usable | Δ |
| Defective | X |

"Wettability"
The specimens were visually checked after being
cooled to room temperature, and the following evaluation
criteria were established.

| Evaluation criteria | Evaluation |
|---|---|
| No dewetting | ○ |
| Slight dewetting | Δ |
| Severe dewetting | X |

Tables 5 and 6 show that the examples of the invention have a smaller change in viscosity, in particular, in a high temperature region than the comparative examples. The examples of the invention are also free from "rough and crumbling" and have an excellent stability with age.

A mixture of dicarboxylic acids, in particular, glutric acid, malonic acid, sebacic acid, suberic acid, and glucopyranosylamine type nanotube in combination controls synergistically a rise in viscosity with age and the creation of "rough and crumbling" in an excellent fashion.

Table 7 shows that the examples of the invention distinctly improves wettability in comparison with the comparative examples.

Solder spreading tests were conducted on example 1 and comparative example 1 in accordance with JIS-Z-3197 standard. Example 1 has a spreading rate of 85.5% and comparative example 1 has a spreading rate of 1.3%. The solder flux of the invention results in a high spreading rate, and provides an excellent solderability.

INDUSTRIAL APPLICABILITY

The flux and the soldering paste of the invention provide an excellent stability with age, and is also excellent in wettability and spreading characteristics. The flux and the soldering paste are expected to be widely used.

The invention claimed is:

1. A flux comprising a resin, a thixo agent, an activator, a solvent and an amount of a glucopyranosylamine nanotube effective to control the viscosity of a soldering paste composition formed by combining the flux with a solder powder to form the soldering paste.

2. The flux according to claim 1, wherein the amount of the glucopyranosylamine nanotube is 0.01-10 weight percent of the flux.

3. A soldering paste composition comprising the flux of claim 1 and a solder powder.

4. The soldering paste composition according to claim 3, wherein the solder powder is free from lead or an alloy containing lead.

5. The soldering paste composition according to claim 3, wherein the solder powder comprises Sn—Cu—Ni.

6. The soldering paste composition according to claim 3, wherein the solder powder comprises Sn—Ag—Cu.

7. The soldering paste composition according to claim 3, wherein the solder powder is 70-95 weight percent of the soldering paste composition.

8. The soldering paste composition according to claim 3, wherein the solder powder has a particle diameter of 0.1-100 μm.

9. The flux according to claim 1, wherein the activator is an organic dicarboxylic acid.

10. The soldering paste composition according to claim 4, wherein the solder powder is 70-95 weight percent of the soldering paste composition.

11. The soldering paste composition according to claim 5, wherein the solder powder is 70-95 weight percent of the soldering paste composition.

12. The soldering paste composition according to claim 6 wherein the solder powder is 70-95 weight percent of the soldering paste composition.

13. The soldering paste composition according to claim 4, wherein the solder powder has a particle diameter of 0.1-100 μm.

14. The soldering paste composition according to claim 5, wherein the solder powder has a particle diameter of 0.1-100 μm.

15. The soldering paste composition according to claim 6, wherein the solder powder has a particle diameter of 0.1-100 μm.

16. The soldering paste composition according to claim 7, wherein the solder powder has a particle diameter of 0.1-100 μm.

17. The flux according to claim 2, wherein the activator is an organic dicarboxylic acid.

18. The soldering paste according to claim 3, wherein the activator is an organic dicarboxylic acid.

19. The soldering paste according to claim 4, wherein the activator is an organic dicarboxylic acid.

20. The soldering paste according to claim 5, wherein the activator is an organic dicarboxylic acid.

21. The soldering paste according to claim 6, wherein the activator is an organic dicarboxylic acid.

22. The soldering paste according to claim 7, wherein the activator is an organic dicarboxylic acid.

23. The soldering paste according to claim 8, wherein the activator is an organic dicarboxylic acid.

24. The flux according to claim 1, wherein the soldering paste viscosity changes from 15-30% when the soldering paste is held at 40° C. for 168 hours.

25. The flux according to claim 1, wherein the soldering paste viscosity changes from 5-15% when the soldering paste is held at 20° C. for 168 hours.

26. The flux according to claim 1, wherein the soldering paste viscosity changes less than 5% when the soldering paste is held at 5° C. for 168 hours.

27. The flux according to claim 1, wherein the amount of the glucopyranosylamine nanotube is an effective amount to control visible dewetting of the soldering paste composition.

28. The flux according to claim 27, wherein the soldering paste composition has no visible dewetting when heated on a copper plate at 250° C. for 30 seconds and afterward cooled to room temperature.

29. The flux according to claim 27, wherein the soldering paste has slight visible dewetting when heated on a copper plate at 250° C. for 30 seconds and afterward cooled to room temperature.

30. The flux according to claim 1, wherein the activator is included in the glucopyranosylamine nanotube.

31. The flux according to claim 9, wherein the organic dicarboxylic acid is selected from the group consisting of malonic acid, succinic acid, maleic acid, glutaric acid, suberic acid, and adipic acid.

32. The flux according to claim 1, wherein the activator is from 0.01 to 30 weight percent of the flux.

33. A soldering paste consisting essentially of (i) a flux consisting essentially of a resin, a thixo agent, an activator, a solvent and an amount of a glucopyranosylamine nanotube effective to control the viscosity of the soldering paste; and (ii) a soldering powder.

\* \* \* \* \*